(12) United States Patent
Burke et al.

(10) Patent No.: US 7,115,425 B2
(45) Date of Patent: Oct. 3, 2006

(54) INTEGRATED CIRCUIT PROCESS MONITORING AND METROLOGY SYSTEM

(75) Inventors: Peter A. Burke, Portland, OR (US);
Eric J. Kirchner, Troutdale, OR (US);
James R. B. Elmer, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/072,127

(22) Filed: Mar. 4, 2005

(65) Prior Publication Data

US 2005/0181615 A1 Aug. 18, 2005

Related U.S. Application Data

(62) Division of application No. 09/952,790, filed on Sep. 11, 2001, now Pat. No. 6,964,924.

(51) Int. Cl.
*H01L 21/66* (2006.01)
(52) U.S. Cl. .................. 438/14; 438/7; 438/10; 438/15
(58) Field of Classification Search .............. 438/14, 438/7, 10, 11, 15, 16, 17, 18, 424, 427, 690–692
See application file for complete search history.

(56) References Cited

U.S. PATENT DOCUMENTS 5,981,354 A * 11/1999 Spikes et al. ............ 438/424
6,057,068 A * 5/2000 Raeder et al. ............ 382/145
6,454,899 B1 * 9/2002 Campbell et al. ..... 257/E21.525

\* cited by examiner

*Primary Examiner*—Kevin M. Picardat
(74) *Attorney, Agent, or Firm*—Luedeka, Neely & Graham

(57) ABSTRACT

A method for monitoring polishing process parameters for an integrated circuit structure on a substrate. A first metrology site is constructed on the substrate. The first metrology site represents a design extreme of a high density integrated circuit structure. The first metrology site is formed by placing a relatively small horizontal surface area trench within a relatively large surface area field of a polish stop material. A second metrology site is also constructed on the substrate. The second metrology site represents a design extreme of a low density integrated circuit structure. The second metrology site is formed by placing a relatively large horizontal surface area trench within a relatively small surface area field of a polish stop material. The substrate is covered with a layer of an insulating material, thereby at least filling the trenches. A target thickness of the insulating material necessary to leave the trenches substantially filled to a top surface of the field of polish stop material is calculated. The substrate is polished until a first thickness of the insulating material in the trench of the first metrology site is no more than the target thickness. A second thickness of the insulating material in the trench of the second metrology site is measured, and values based on the first thickness and the second thickness are monitored as the polishing process parameters for the integrated circuit structure.

6 Claims, 6 Drawing Sheets

INTEGRATED CIRCUIT PROCESS MONITORING AND METROLOGY SYSTEM

This is a divisional of application Ser. No. 09/952,790 filed Sep. 11, 2001 now U.S. Pat. No. 6,964,924.

FIELD

In general, this invention relates to the field of integrated circuit manufacturing. More particularly, this invention relates to structures for monitoring over processing and under processing conditions in a polishing process.

BACKGROUND

In integrated circuit manufacturing, control of the various processes is key to achieving high yields, low scrap rates and low defect levels. For a process to function well in manufacturing, statistical process control monitoring methods are typically integrated into the process. Thus, high quality process designs are generally dependent upon the metrology methods used to statistically monitor and control the process.

Shallow trench isolation structures are generally formed on a semiconducting substrate, such as a silicon wafer. The upper surfaces of the substrate are typically coated with a fairly thin layer of a relatively hard electrically insulating material, which functions as a polish stop at a later point in the processing. Typically, silicon nitride is the material selected as the polish stop layer. The isolation trenches are then etched through the polish stop layer into the substrate. The trench is filled with an electrically insulating material, such as silicon dioxide. Sometimes the surfaces of the trench are then also coated with a polish stop layer.

As the insulating material is deposited in the trench, it is also typically deposited on the other upper surfaces of the substrate. Preferably, both the insulating material and the polish stop material are removed from all of the upper surfaces of the substrate, except from inside of the trenches. Most preferably, after the insulating material and the polish stop material are removed from these other upper surfaces, the top surface of the shallow trench isolation structure is planar with the top surface of the substrate surrounding the shallow trench isolation structure.

Direct chemical mechanical polishing is a typical process used to remove the insulating material down to the level of the polish stop layer. After the direct chemical mechanical polishing step, a wet etch process may be used to strip away the undesired polish stop layer. However, if the direct chemical mechanical polishing process does not remove all of the insulating layer from the top surface of the polish stop layer, and some of the insulating layer remains on top of the polish stop layer, then the stripping chemicals for the polish stop layer cannot reach those portions of the polish stop layer that are below the remaining insulating layers. This tends to result in residual polish stop material that is left behind on the substrate, when it should have all been removed. This residual material inhibits the subsequent formation of desired structures and decreases the manufacturing yield of the process. Thus, it is generally important that the shallow trench isolation structure be properly polished.

Conversely, when the isolation structures are over polished, the polishing process thins or "dishes" the insulating material in the trench. Furthermore, the polish stop layer may be thinned to the point that the shallow trench isolation structures are damaged. This damage may be caused directly by the polishing process, or indirectly by subsequent processing. If over polishing is severe, then portions of the polish stop layer may be completely eroded during the polishing, allowing the substrate below the polish stop layer to be damaged. Such damage decreases the yield of the manufacturing process, and thus increases the cost of producing the integrated circuits.

Different integrated circuit designs have different shallow trench isolation circuit patterns, which respond differently to a given amount of polishing. Thus, it is difficult to design a shallow trench isolation polishing process that works well for all designs. One factor that tends to affect the polishing rate of the isolation structures is the density of the structures, or in other words, how close the structures are to one another. Therefore, since the key to shallow trench isolation processing is the removal of all of the insulating material above the polish stop layer, but limited or no removal of the material within the trench, the polishing process must either be capable to correctly process all of the different circuit patterns, or adjusted on a pattern by pattern basis.

What is needed, therefore, is a system for readily determining how a given direct chemical mechanical polishing process affects the thickness of the insulating material layer on both high density shallow trench isolation structures and low density shallow trench isolation structures.

SUMMARY

The above and other needs are met by a method monitoring polishing process parameters for an integrated circuit structure on a substrate. A first metrology site is constructed on the substrate. The first metrology site represents a design extreme of a high density integrated circuit structure. The first metrology site is formed by placing a relatively small horizontal surface area trench within a relatively large surface area field of a polish stop material.

A second metrology site is also constructed on the substrate. The second metrology site represents a design extreme of a low density integrated circuit structure. The second metrology site is formed by placing a relatively large horizontal surface area trench within a relatively small surface area field of a polish stop material.

The substrate is covered with a layer of an insulating material, thereby at least filling the trenches. A target thickness of the insulating material necessary to leave the trenches substantially filled to a top surface of the field of polish stop material is calculated. The substrate is polished until a first thickness of the insulating material in the trench of the first metrology site is no more than the target thickness. A second thickness of the insulating material in the trench of the second metrology site is measured, and values based on the first thickness and the second thickness are monitored as the polishing process parameters for the integrated circuit structure.

Using metrology sites that are configured to represent worse case scenarios with regard to under polishing or over polishing allows the manufacturing process to be improved without the need for extensive testing or inspecting. Since the metrology sites represent worse case scenarios, all possible patterns within the die are preferably processed better than the metrology sites. In addition, the use of metrology sites preferably reduces, and most preferably eliminates the need to customize the direct polishing process for each particular circuit pattern. Therefore, less engineering time tends to be required and the cost of producing the integrated circuits is preferably reduced.

In various preferred embodiments of the invention, the metrology sites are constructed on scribe lines, and most preferably the intersections of scribe lines between the integrated circuits of the substrate. The integrated circuit structure is most preferably a shallow trench isolation structure. The first metrology site preferably represents a worst case for under polishing and the second metrology site preferably represent a worst case for over polishing. There is preferably included an additional step of statistically monitoring a difference between the first thickness and the second thickness. Most preferably the polishing process is controlled based on the statistical monitoring.

According to another aspect of the invention, there is provided a test structure set for determining a polishing process parameter range for an integrated circuit structure on a substrate. A first metrology site on the substrate represents a design extreme of a high density integrated circuit structure. The first metrology site has a relatively small horizontal surface area trench filled with an insulating material, within a relatively large surface area field of a polish stop material.

A second metrology site on the substrate represents a design extreme of a low density integrated circuit structure. The second metrology site has a relatively large horizontal surface area trench filled with the insulating material, within a relatively small surface area field of the polish stop material.

As previously discussed, the use of the metrology sites preferably eliminates the need to measure and monitor the effects of polishing on individual regions of the integrated circuit structure. Thus, the structures of the present invention tend to decrease the cost of the manufacturing process. Furthermore, constructing the metrology sites on the scribe lines used to divide the integrated circuit substrate into different circuits tends to conserve space on the substrate, and thereby tends to further increase the cost efficiency with which the final product is produced.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
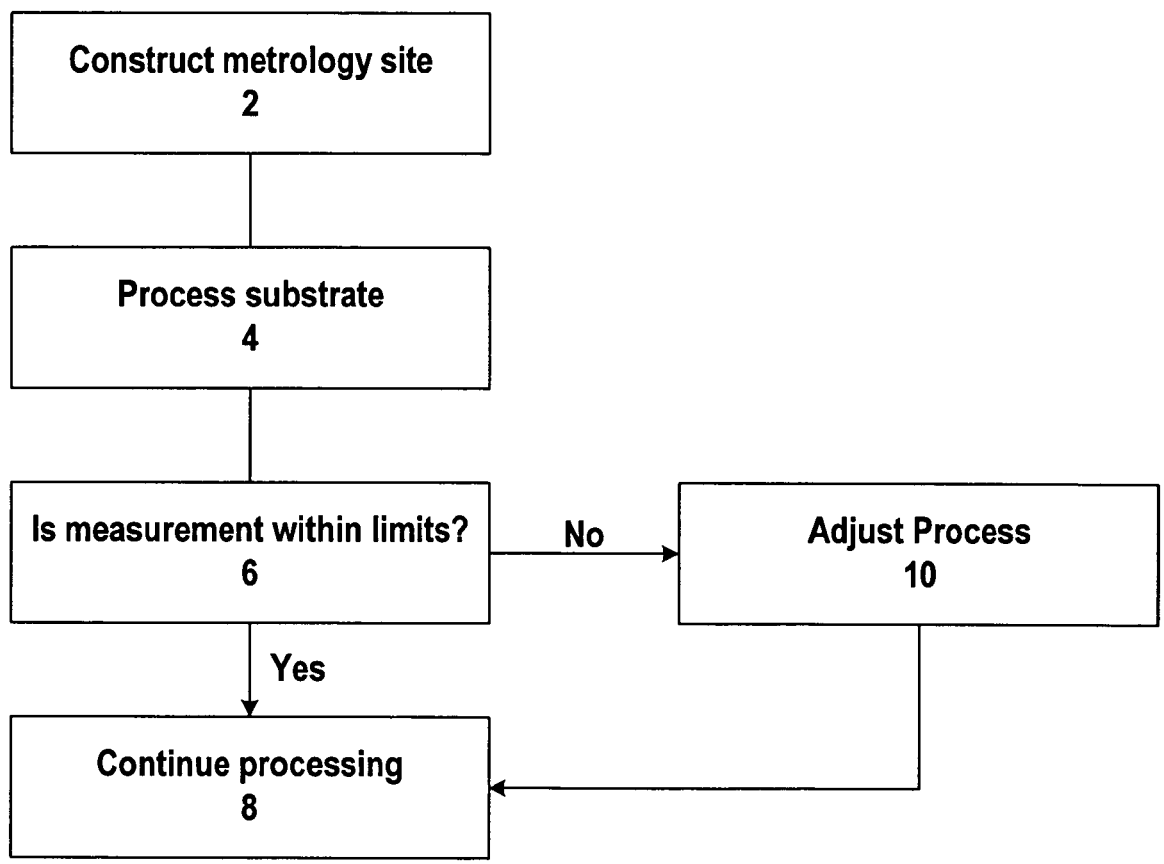
FIG. 1 is a flow chart of a preferred method in accordance with the present invention.

The present invention is directed toward methods and apparatuses for improving the manufacturing of integrated circuits. A flow chart of a preferred method in accordance with the present invention is set forth in FIG. 1. The method commences in block 2 with the constructing of a metrology site on a substrate. As discussed in more detail below, the metrology site is preferably constructed such that it represents a worst case or extreme condition with regard to a defect that may occur during the manufacturing of integrated circuits.

For example, when direct polishing integrated circuits in accordance with a shallow trench isolation process, regions where the filled trenches have a relatively small surface area are more likely to be under polished than regions where the filled trenches have a relatively large surface area. In other words, relatively small trenches that are surrounded with a relatively high density of polish stop fields, called high density areas herein, tend to be under polished. Conversely, relatively large trenches that are surrounded with a relatively low density of polish stop field, called low density areas herein, tend to be over polished.

Thus, if it is desired to determine if the integrated circuit is under polished, the metrology site is preferably constructed to have a relatively high density, or in other words to have relatively small trenches bounded by relatively large fields of polish stop material. Therefore, if a measurement is taken at the metrology site and it is determined that the metrology site is not under polished, it can be inferred that the rest of the structures, which preferably have a lower density than the metrology site, are not under polished.

Similarly, if the metrology site is under polished, there is a good chance that other structures are under polished. While the preferred embodiment of the present invention is directed toward determining if an integrated circuit has been properly polished, it will be readily appreciated by those skilled in the art that a wide variety of different properties may be tested with a metrology site as disclosed in the present application and that the above discussed metrology site is exemplary only.

Once the metrology site has been constructed, a manufacturing process is performed on the substrate, as shown in block 4. After the manufacturing process has been performed, the method proceeds to block 6 wherein the metrology site is examined to determine if the manufacturing process had the desired effect on the metrology site. If the examination of the metrology site indicates that the manufacturing process had the desired effect, processing of the substrate continues as given in block 8.

However, if the examination of the metrology site indicates that the manufacturing process did not have the desired results, the predetermined manufacturing parameters are adjusted in block 10 to correct the manufacturing process and the substrate is processes according to the adjusted manufacturing process. Thus, the provision of a metrology site allows the manufacturing process to be improved through the use of feedback without requiring extensive monitoring and measuring of all of the actual elements of the integrated circuit device to be produced.

Figure 2:
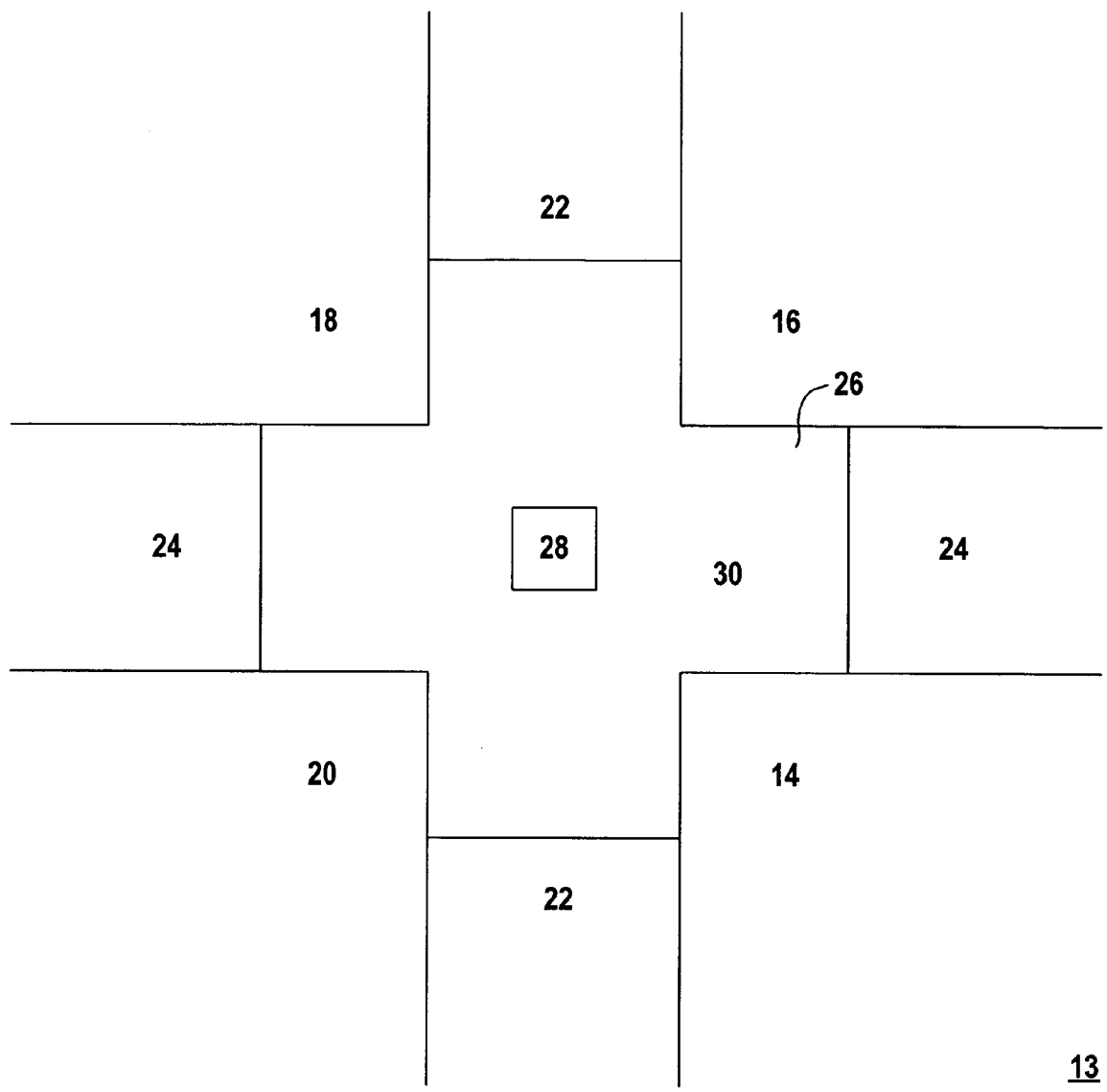
FIG. 2 depicts a top view of a first metrology site in accordance with the present invention.

An example of a first metrology site 26 for use with a preferred embodiment of the present invention is set forth in FIG. 2. More particularly, FIG. 2 shows a portion of an integrated circuit substrate 13 that is divided into four sections 14, 16, 18, and 20 by two intersecting scribe lines 22 and 24. The scribe lines 22 and 24 are typically used during the manufacture of integrated circuit chips to divide the substrate 13 into integrated circuits 14, 16, 18, and 20. Once the manufacturing process has been completed, the integrated circuits 14, 16, 18, and 20 are separated by cutting the substrate 13 along the scribe lines, such as scribe lines 22 and 24. Therefore, the first metrology site 26 can be constructed in the scribe lines 22 and 24 without significantly diminishing the amount of area on the substrate 13 that is used to construct the integrated circuits 14, 16, 18, and 20. Thus, placing the first metrology site 26 on the scribe lines 22 and 24, and most preferably at the intersection of the scribe lines 22 and 24 as depicted in FIG. 2, increases the efficiency and yield of the manufacturing process.

The first metrology site 26 shown in FIG. 2 is configured to provide a test site that is used to determine if specific structures within the integrated circuits 14, 16, 18, and 20 have been properly processed. In particular, the integrated circuits 14, 16, 18, and 20 shown in FIG. 2 include shallow trench isolation structures. A polish stop layer, such as polish stop layer 30, is deposited and patterned on top of portions of the substrate 13. Most preferably, the polish stop layer 30 is formed of silicon nitride. Trenches, such as trench 28, are etched into the substrate 13, typically a silicon substrate 13, preferably by using the polish stop layer 30 as a mask.

A layer of an electrically insulating material is then deposited over the surface of the substrate 13, including the trench 28. The electrically insulating material is most preferably an oxide, such as silicon dioxide. The substrate 13 is then subjected to a direct polishing process to remove the electrically insulating layer down to the top of the polish stop layer 30, such that the electrically insulating layer remains only in the trenches 28. Thus, if the integrated circuits 14, 16, 18, and 20 are under polished, a small amount of the electrically insulating layer remains above portions of the polish stop layer 30. This remaining electrically insulating layer is undesirable in that it may result in failure of the finished integrated circuits.

Figure 3:
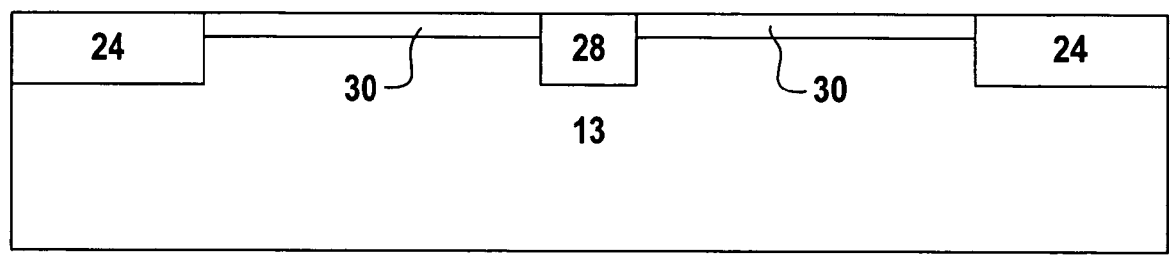
FIG. 3 depicts a cross sectional view of the first metrology site.

FIG. 3 depicts a cross sectional view of the first metrology site 26 of FIG. 2 that more clearly shows the trenches 28 filled with the insulating material and the fields of the polish stop layer 30. FIG. 3 depicts the first metrology site 26 after polishing, where there has been no over polishing or under polishing. If the first metrology site 26 as depicted in FIG. 3 had been under polished, then some of the insulating material in the trench 28 would also be present on top of the polish stop layer 30. If the first metrology site 26 as depicted in FIG. 3 had been over polished, then some of the insulating material in the trench 28 would be removed from the trench 28, resulting in a dishing or other recessing of the surface of the insulating material within the trench 28.

The first metrology site 26 shown in FIGS. 2 and 3 is constructed such that, when properly polished, the trench 28 has the insulating material left in it, but there is not insulating material overlying the polish stop layer 30. Insulating material may also be left within other recesses, such as those formed in the scribe lines 24, as depicted in FIG. 3. The ratio of the surface area of the polish stop layer 30 in the first metrology site 26 to the horizontal surface area of the trench 28 is selected to be a higher number than any equivalent structure within the integrated circuits 14, 16, 18, and 20. In other words, the first metrology site 26 is designed to be a worst case high density structure, in that it has a higher density of polish stop 30 to trench 28 than any of the equivalent structures in the integrated circuits 14, 16, 18, and 20.

The horizontal surface area of a structure is that component of the surface area of the structure, such as a trench, that is seen when looking down on the structure from above. For example, when looking down into a trench with vertical side walls, only the bottom of the trench is visible. Thus, in this example, only the bottom of the trench is included in the horizontal surface area of the trench. The surface areas of the side walls, which may be quite large, depending on the depth of the trench, are not included in the horizontal surface area of the trench in this example. If the side walls of the trench are sloped, such that a component of the surface area of the side walls of the trench is visible when view from above the trench, then that component of the surface area of the side walls of the trench is included within the horizontal surface area of the trench. In other words, the horizontal surface area of the trench can be more easily thought of as the imaginary surface area of a surface having a perimeter with the size of the top opening of the trench.

Structures that have a high density such as first metrology site 26 tend to be under polished when subjected to a predetermined amount of polishing. Thus, by selecting the density of the first metrology site 26 to be higher than the highest density structure in the integrated circuits 14, 16, 18, and 20, the metrology site 26 is preferably constructed such that no structure in the integrated circuits 14, 16, 18, and 20 has a higher likelihood of being under polished when subjected to a given polishing process. Therefore, if an examination of the first metrology site 26 indicates that the first metrology site 26 is not under polished, it is preferably assumed that the equivalent structures of the integrated circuits 14, 16, 18, and 20 are not under polished.

Figure 4:
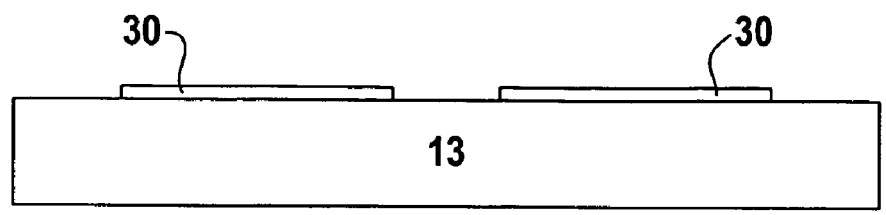
FIGS. 4–7 depict a preferred method of constructing a metrology site in accordance with the present invention.
Figure 5:
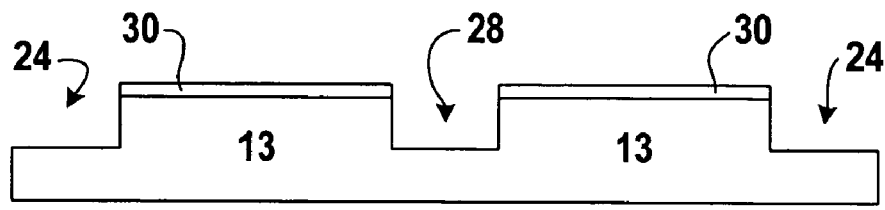
Figure 6:
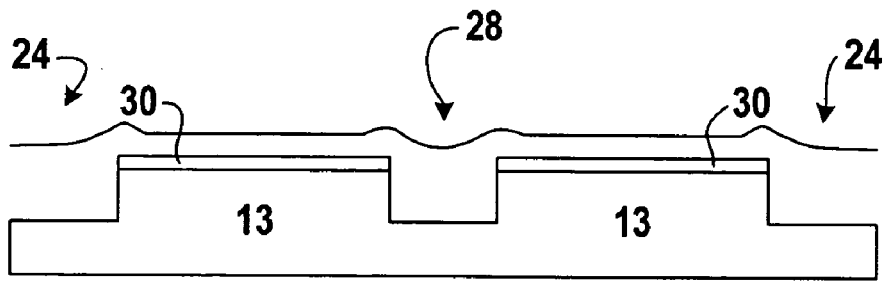

The metrology site 26 is preferably formed during a shallow trench isolation integrated circuit manufacturing process. The shallow trench isolation process begins with the deposition of a polish stop layer 30 over the substrate 13, as shown in FIG. 4, which is then patterned. The polish stop layer 30 is then preferably used as a mask to etch trenches 28 and 24 as shown in FIG. 5. Additional polish stop layer 30 may or may not be deposited within the trenches 28 and 24 after they are formed. The electrically insulating layer is next deposited over the entire surface of the substrate 13, including over both the polish stop layer 30 and in the trenches 28 and 24, as depicted in FIG. 6.

Figure 7:
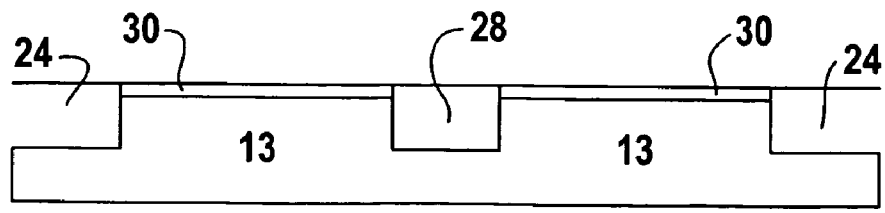

As depicted in FIG. 7, the electrically insulating layer is preferably polished down such that the electrically insulating layer is removed from all top surfaces of the polish stop layer 30, and the trenches 28 and 24 are filled to the top with the electrically insulating layer. As previously discussed, the trench 28 has been designed as a relatively high density structure, such that it tends to be polished to a lesser extent than structures in other areas.

Thus, by calculating the thickness of insulating material that should be present in the trench 28 to just reach to the top of the polish stop layer 30, and then measuring the thickness of the insulating material in the trench 28 after polishing, it can be determined whether the polishing process has been sufficiently rigorous as to adequately polish a worst case structure for under polishing. If such a structure has been sufficiently polished, then preferably all of the structures within the integrated circuits 14, 16, 18, and 20 have been sufficiently polished. However, if the first metrology site 26 has not been sufficiently polished, other structures on the substrate 13 may also not have been sufficiently polished and the manufacturing process should be adjusted to provide for a more robust polishing of the substrate 13.

Figure 8:
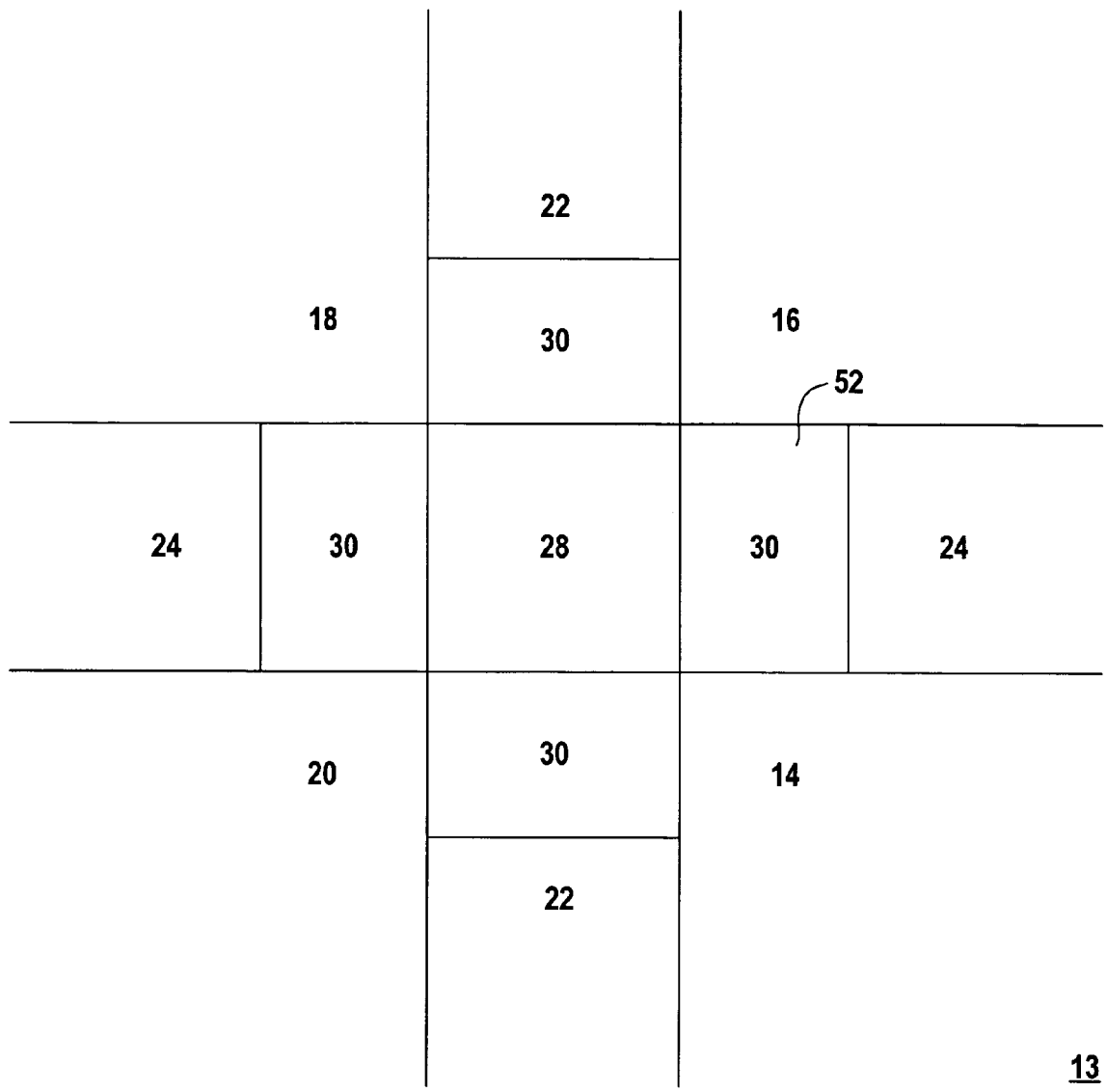
FIG. 8 is a top view of a second metrology site constructed in accordance with the present invention.

The present invention also encompasses embodiments wherein the metrology site is configured to determine if the integrated circuit has been over polished. A second metrology site 52 is depicted in FIG. 8. Structures having a large proportion of trenched areas and a low proportion of polish stop areas, low density structures, tend to be polished to a greater degree than areas having a lower proportion of trenched areas and a high proportion of polish stop areas. Thus, the second metrology site 52 is preferably constructed such that it has a relatively low density, in that the horizontal surface area of the trench 28 is relatively high when compared to the surface area of the polish stop layer 30. Most preferably, the second metrology site 52 has a lower density than any other structure in the integrated circuits 14, 16, 18, and 20. The metrology site 52 is also preferably constructed in a scribe line, and most preferably at the intersection of the scribe lines 22 and 24, as depicted in FIG. 8.

Once the polishing step of the manufacturing process has been completed, a measurement of the thickness of the oxide layer in the trench 28 of the second metrology site 52 is taken to determine if the second metrology site 52 has been over polished. If the second metrology site 52 has not been over polished, then the rest of the integrated circuit 48 has preferably not been over polished, as the second metrology site 52 preferably represent a worst case for over polishing. Over polishing causes dishing or erosion of the over polished area and may render the affected circuit inoperable. Therefore, if the measurement indicates that the second metrology site 52 is over polished, the manufacturing process is preferably adjusted such that the degree of polishing is reduced.

It is appreciated that the exact design of the metrology sites is preferably influenced at least in part by the process margins achieved during the manufacturing process. For example, when using a chemical mechanical polishing process, the metrology sites are preferably designed in conjunction with the actual process margin achieved in the chemical mechanical polishing process and the design limits of the chip layout. If the design forbids shallow trench isolation structures with polish stop layers 30 greater than eighty microns square, for example, then constructing a first metrology site with a polish stop layer slightly larger than eighty microns square will tend to be the worse case scenario for under polishing.

Similarly, if the design rules state that the horizontal surface area of the trench 28 can be no more than seventy-five percent of the total surface area of the structure, including the polish stop layer 30, in areas less than one hundred microns square, then constructing a second metrology with a trench surface area of greater then seventy-seven percent in structure of at least that size will tend to be a worst case for over polishing of the structure. Therefore, the actual construction of the metrology sites preferably depends at least in part upon the design limits of the integrated circuits to be created.

Preferably, first metrology sites 26 and second metrology sites 52 are combined on a single substrate 13, to provide a process window that defines the amount of polishing required for the particular substrate 13. If the first metrology site 26 indicates that the substrate 13 is under polished, a more rigorous polishing process is preferably incorporated into the manufacturing process. If the second metrology site 52 indicates that the substrate 13 has been over polished, a less rigorous polishing process is preferably incorporated into the manufacturing process. Preferably, because the metrology sites 26 and 52 represent worst cases of the over polishing and the under polishing extremes as dictated by the design rules, all of the structures within the integrated circuits 14, 16, 18, and 20 on the substrate 13 are processed properly.

Thus, by tracking the performance of these two metrology sites and ensuring that they are properly processed, a process engineer can preferably eliminate the need to perform intense inspections and measurements to determine different process windows for a particular polishing pattern or manufacturing process. Furthermore, after a number of iterations have been performed, the proper amount of polishing within manufacturing tolerances will preferably have been determined and the metrology sites can be spot checked at random intervals to insure that the manufacturing equipment does not need recalibrating. Since integrated circuits are typically manufactured in large quantities, only a relatively small number of measurements preferably need to be taken before the proper process window is determined. Thus, the present invention tends to decrease the cost of manufacturing integrated circuits and increase the yields of the manufacturing process.

Figure 9:
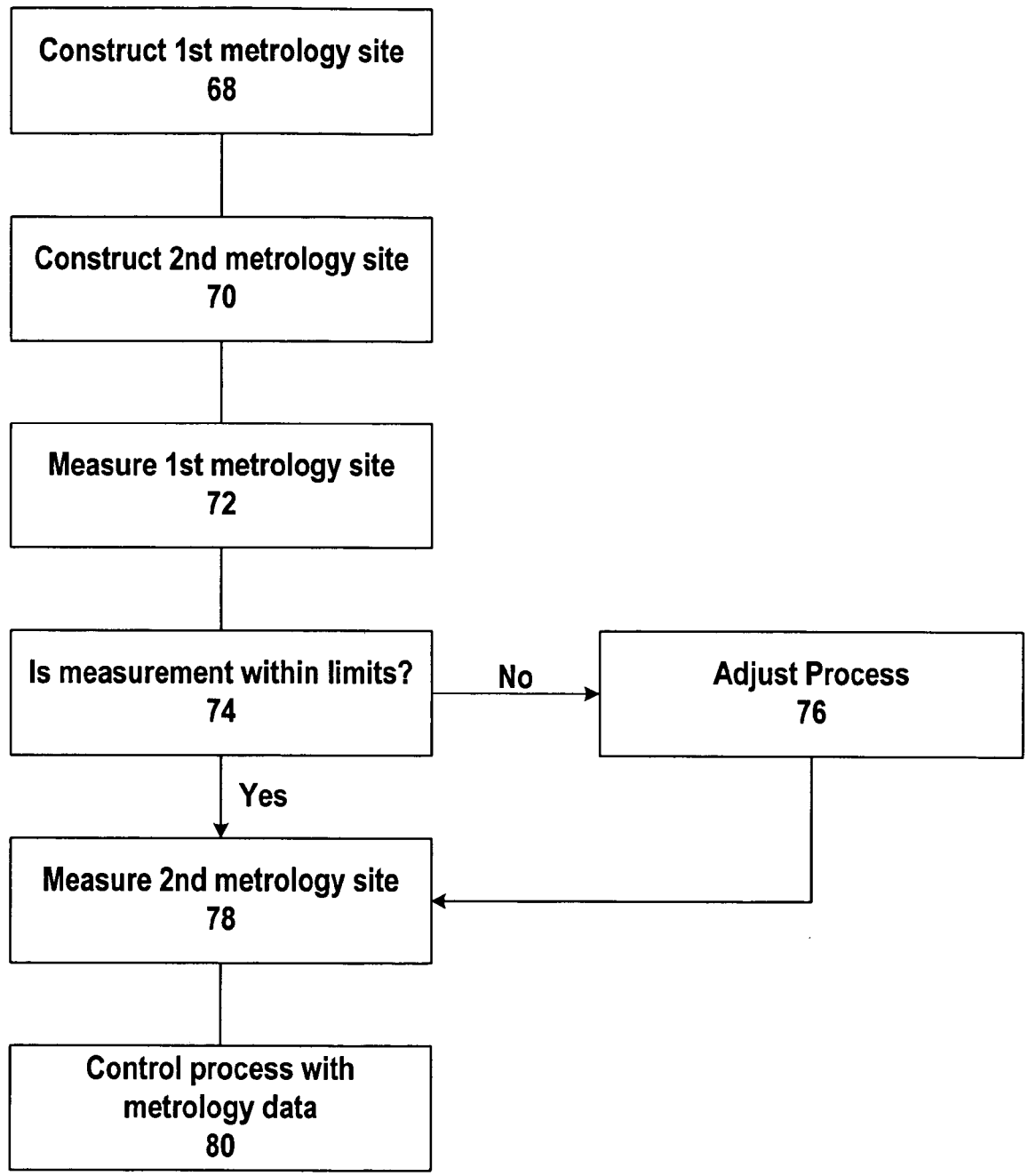
FIG. 9 is a flow chart of a preferred method of establishing a process window for a manufacturing process.

FIG. 9 is a flow chart of a preferred method of establishing a process window for a manufacturing process using metrology sites that are constructed to represent worst case manufacturing scenarios. The method commences in block 68 with the construction of a first metrology site 26 that represents a lower process limit for the process window of a manufacturing process. As given in block 70, a second metrology site 52 is constructed that represents an upper process limit for the process window of the manufacturing window. In the preferred embodiment of the present invention, the lower process limit represents the worst case scenario for under polishing, and the upper process limit represents the worst case scenario for over polishing.

It is appreciated that in actual practice, both the first metrology site 26 and the second metrology site 52 are preferably constructed at the same time. However, the construction of the first metrology site 26 and the second metrology site 52 are represented in the flow chart of FIG. 9 as separate steps only for the purpose of clarity in distinguishing the first metrology site 26 and the second metrology site 52 as separate metrology sites.

Once the metrology sites have been constructed, the process proceeds to block 72 wherein measurements of the monitored properties in the lower limit first metrology site 28 are taken. If it is determined in block 74 that the monitored property in the lower limit first metrology site 28 is outside of the acceptable range, such as if the oxide thickness is greater than a target oxide thickness that extends to a level substantially equal to the top of the polish stop layer, then the manufacturing process is adjusted to further decrease the oxide thickness, as set forth in block 76. When the monitored property is in a proper range, such as when a measured oxide thickness is no greater than the target thickness of the oxide in the first metrology site 28, then the thickness of the oxide is measured in the second metrology site 52, which may at this point be over polished. This step is given as block 78 in FIG. 9.

This range of measured thicknesses of oxide from the first metrology site 28 and the second metrology site 52 is preferably tracked, such as with statistical methods like control charting, to control the polishing process. The difference in oxide thickness between the two metrology sites preferably represents the greatest difference in oxide thickness that would be observed in any of the equivalent structures, such as the shallow trench isolation structures, in the integrated circuits 14, 16, 18, and 20. Thus, if the polishing process produces a range of thickness in the metrology sites that is acceptable, then it is assumed that the oxide thickness in the shallow trench isolation structures of the integrated circuits 14, 16, 18, and 20 is also within a smaller, and also acceptable range.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A test structure set for determining a polishing process parameter range for an integrated circuit structure on a substrate, the test structure set comprising:

a first metrology site on the substrate, the first metrology site representing a design extreme of a high density integrated circuit structure, the first metrology site having a relatively small horizontal surface area trench filled with an insulating material within a relatively large surface area field of a polish stop material, where the first metrology site is disposed at a first intersection of two scribe lines that are disposed at substantially right angles between four adjacent integrated circuits, the trench is both not as wide and as long as a width of the scribe lines and thereby does not completely fill the first intersection of the two scribe lines, and the field is both at least as wide and at least as long as the width of the scribe lines and thereby substantially completely fills the first intersection of the two scribe lines, and a second metrology site on the substrate, the second metrology site representing a design extreme of a low density integrated circuit structure, the second metrology site having a relatively large horizontal surface area trench filled with the insulating material within a relatively small surface area field of the polish stop material where the second metrology site is disposed at a second intersecion of two scribe lines that are disposed at substantially right angles between four adjacent circuits, the second intersection different from the first intersection, the trench is both substantially as wide and substantially as long as a width of the scribe lines and thereby substantially completely fills the second intersection of the two scribe lines, and the field is both wider ad longer than the width of the two scribe lines and thereby extends past the second intersection of the two scribe lines and along both of the two scribe lines in four orthogonal directions.

2. The test structure set of claim 1 wherein the first metrology site further comprises a plurality of first metrology sites, and the second metrology site further comprises a plurality of second metrology sites.

3. The test structure set of claim 1 wherein the metrology site further compirses a plurality of first metrology sites, and the second metrology site further comprises a plurality of second metrology sites, and sets of one first metrology site and one second metrology site are substantially uniformly distributed across the substrate.

4. The test structure set of claim 1 wherein the integrated circuit structure is a shallow trench isolation structure.

5. The test structure set of claim 1 wherein the first metrology site represents a worst case for under polishing and the second metrology site represents a worst case for over polishing.

6. The test structures of claim 1 wherein the first metrology sites and the second metrology sites are disposed in adjacent intersections.

* * * * *